United States Patent [19]
Lee et al.

[11] Patent Number: 5,309,112
[45] Date of Patent: May 3, 1994

[54] SWITCHED-CAPACITOR CIRCUIT POWER DOWN TECHNIQUE

[75] Inventors: King F. Lee, Ft. Lauderdale; Norman T. Rollins, Sunrise, both of Fla.

[73] Assignee: Motorola, Inc., Schaumburg, Ill.

[21] Appl. No.: 914,907

[22] Filed: Jul. 16, 1992

[51] Int. Cl.$^5$ ............................................. H03K 5/01
[52] U.S. Cl. ..................................... 328/151; 328/167; 307/520
[58] Field of Search ............... 307/272.3, 355, 362, 307/296.1, 296.4, 520; 328/167, 151

[56] References Cited

U.S. PATENT DOCUMENTS

| | | |
|---|---|---|
| 4,313,096 | 1/1982 | Fleischer . |
| 4,516,082 | 5/1985 | Smith et al. . |
| 4,520,283 | 5/1985 | Sasaki et al. ........................ 307/296.1 |
| 4,560,890 | 12/1985 | Masuda et al. ........................ 307/355 |
| 4,600,904 | 7/1986 | Schumaker . |
| 4,604,584 | 8/1986 | Kelley . |
| 4,622,480 | 11/1986 | Uchimura et al. .................. 307/520 |
| 4,659,996 | 4/1987 | Nadir .................................... 328/167 |
| 4,698,531 | 10/1987 | Jones ................................. 307/272.3 |
| 4,716,319 | 12/1987 | Rebeschini . |
| 4,760,346 | 7/1988 | Kultgen et al. . |
| 4,862,121 | 8/1989 | Hochschild . |
| 4,902,907 | 2/1990 | Haga et al. ........................ 307/272.3 |
| 5,182,521 | 1/1993 | Chang et al. ........................ 328/167 |

OTHER PUBLICATIONS

1981 *IEEE*-"Bilinear Switched-Capacitor Ladder Filters"-IEEE Transactions on Circuits and Systems, vol. CAS-28, No. 8, Aug. 1981.

Primary Examiner—Richard A. Bertsch
Assistant Examiner—David W. Scheuermann
Attorney, Agent, or Firm—Juliana Agon

[57] ABSTRACT

A method and apparatus for reducing the settling time of a switched-capacitor circuit (10) which includes at least one capacitor (20) having at least one terminal connected to a switch. The method comprises the step of clocking the switched-capacitor circuit at a switching clocking frequency. In response to a control signal (51), the at least one terminal of the at least one capacitor (20) is biased to a reference voltage potential.

16 Claims, 2 Drawing Sheets

SWITCHED-CAPACITOR CIRCUIT POWER DOWN TECHNIQUE

TECHNICAL FIELD

This invention relates generally to switched-capacitor circuits, and more particularly to a switched-capacitor circuit for minimizing power-up settling times.

BACKGROUND ART

Switched-capacitor circuits are known. Such circuits are the product of circuit design techniques commonly used to miniaturize (integrate) components. In portable (hand-held) radio communication applications, components such as filters, integrators, differential amplifiers, comparators, summers, etc., are often reduced to integrated circuit (IC) form. When a capacitor is switched, by the switches of a switched-capacitor circuit, between a signal source to be sampled and the load, at a rate many times that of the frequency of the sampled signal, the capacitor will simulate the circuit behavior of a resistor between the source and the load. By combining capacitor(s), switched-capacitor(s), and operational amplifier(s), complex functions such as filtering can be implemented efficiently in IC form.

To reduce the current drain (energy consumption) of a switched-capacitor circuit, it is known to activate (or power-up) the operational amplifier (op-amp) associated with the switched-capacitor circuit only when the circuit function is needed, in the normal mode, and to fully deactivate the op-amp (or power-down) when it is not in use, in the power down or idle mode. This powering-down provides maximized energy savings since the majority of current is drawn by the op-amp when activated.

Referring to FIG. 1, a switched-capacitor circuit, implemented as a first order low-pass filter 10, is shown, as an example, illustrating the settling time problem. Settling time is defined to be the time interval, following the initiation of a specified stimulus to a system, required for a specified variable to enter and remain within a specified narrow band centered on the final value of the variable. The switched-capacitor filter 10 comprises an operational amplifier 16, a pair of switched-capacitors 12 and 14 (that simulate resistors when switched rapidly), and a non-switched feedback capacitor 22.

An input signal, $V_{in}$, is coupled to the inverting input of the operational amplifier (Op-amp) 16 by a quadruplet of switches 181-184, collectively referred to as 50 switch or switches 18. Similarly, a quadruplet of switches 191-194, is collectively referred to as switch or switches 19.

As is readily understood in the art, there are at least two phases of switching signals, generated by a multiphase clock generator circuit, associated with the switches 18 and 19. If only two phases are generated, they are commonly called an EVEN (E) phase and an ODD (O) phase. Typically, these E and O signals are of complementary phases and are generated from a biphase non-overlapping clock generator circuit. The switching signals are considered to be non-overlapping when the respective switches they control are never in the closed state simultaneously (E, O = 11). That is, the highs or logical ones of the ODD phase clock signal occur within the lows or logical zeros of the EVEN phase clock signal, and the logical highs or ones of the EVEN phase clock signal occur within the logical lows or zeros of the ODD phase clock signal (E, O = 01, 00, or 10). Hence, during the EVEN clock phase, all the switches marked "EVEN" are closed simultaneously, then opened followed by a closure of all the switches marked "ODD", during the ODD clock phase. It is thus assured that no two adjacent switches are turned on at the same time.

When the switches 18 are closed for the EVEN phase, the current provided by $V_{IN}$ charges the capacitor 12. The charge accumulated on the capacitor 12, during the EVEN switching phase, is re-distributed, or discharged, to the capacitors 14 and 22 when the switches 18 and 19 are closed for the ODD phase.

As in a conventional active RC low-pass filter, the positive, or non-inverting, input of the Op-amp 16 is connected to an analog ground potential $V_{AG}$. The term "virtual ground" or analog ground ($V_{AG}$) is used commonly in analog circuit design to refer to a voltage potential, usually at the middle of the positive and negative power supply potentials, where an analog signal is referenced as zero signal potential.

The Op-amp 16 provides an output signal $V_{out}$, a portion of which is fed back to the negative input of the Op-amp 16 by the feedback capacitor 22 and the feedback switched-capacitor 14 (in conjunction with the switches 19). Thus, the switches 181-184 and the switched-capacitor 12 form a switched-capacitor input network 20. Similarly, the switches 191-194 and the switched-capacitor 14 form a switched-capacitor feedback network 30. Hence, each switched-capacitor network forms a switched-capacitor resistive element or an equivalent resistive element, each having input and output terminals. With four switches shown, as connected, in the commonly known parasitic-insensitive configuration, each of the networks 20 and 30 also forms a parasitic-insensitive switched-capacitor network or resistive element.

Switched-capacitor network 20 is inverting the charging process, because the same clock phase is controlling, on both sides of the switched-capacitor, either the switches (182 and 184) connected to the input terminal and $V_{AG}$ or the switches (181 and 183) connected to $V_{AG}$ and the output terminal. Conversely, switched-capacitor network 30 is non-inverting the charging process, because the same clock phase is controlling, on both sides of the switched-capacitor, either the switches (192 and 194) both connected to $V_{AG}$ or the switches (191 and 193) connected to the input and output terminals. Either the inverting or non-inverting charging configuration can be interchanged, and used suitably, anywhere in a switched-capacitor circuit.

A power down (PD) control signal 51 is coupled to a port of the op-amp 16 to selectively turn the op-amp 16 ON, for normal mode operation, and OFF (the output is tri-stated or open circuited), for power down mode operation.

During normal circuit operation (normal mode), the control signal 51 is at a low logic level, which turns the op-amp 16 ON to provide the output voltage $V_{out}$. When the control signal PD 51 is at a logic high level, representing a power down mode, the output node 28 of the op-amp is floating and essentially disabled with no power flow through the op-amp 16.

In other words, when the op-amp output is tri-stated, the powered-down configuration of the switched-capacitor circuit would be the same as if the op-amp were simply removed. If the E, O non-overlapping clocks remain switching, the circuit becomes a passive network whose node voltages are topologically dependent. Specifically, the continued switching of the switching capacitors 12 and 14 may convert the charges stored in all the capacitors 12, 14, and 22, into undesirable potentials. These stored voltage potentials may result in an undesired average output voltage $V_{out}$.

If the E, O switches 18 and 19 are simply stopped at any of the non-overlapping states (E, O=01 or 10) or the open state (E, O=00), the node voltages will still float to undefined states, due to the presence of leakage currents. When the switched-capacitor circuit 10 is again powered-up by PD=0, node voltages will usually be in these non-$V_{AG}$ DC states which will only decay to $V_{AG}$ after circuit-dependent time constants.

For filters with low corner frequencies, these time constants may be as long as several milliseconds. The problem may be compounded if the offset of the input is varying due to preceding circuits also settling. Consequently, there is a significant delay before a powered-up path settles.

In communication applications, such as in a radio, the switched-capacitor filter 10 is implemented as an integrated circuit (IC) for audio filtering of communication signals. Hence, if a speaker type output load is coupled to the output node 28, during a transition to the power up mode, i.e., the PD 51 signal goes from high to low, a large transient output voltage spike may occur. This large transient may be audible and objectionably loud.

SUMMARY OF THE INVENTION

Briefly, according to the invention, in a switched-capacitor circuit which includes at least one capacitor having at least one terminal connected to a switch, the switched-capacitor circuit is clocked at a switching clocking frequency. In response to a control signal, the at least one terminal of the at least one capacitor is biased to a reference voltage potential.

In accordance with one aspect of the invention, a method for reducing the settling time of a switched-capacitor circuit biases all the internal switchable nodes of the switched-capacitor circuit to the same analog ground voltage potential.

In accordance with another aspect of the invention, a radio having a switched-capacitor network includes a capacitor having first and second terminals, and first, second, third, and fourth switches. A series transistor switch pair is formed with the second switch and the third switch, wherein the switches are connected on each terminal of the capacitor. A parallel transistor switch pair is formed with the first switch and the fourth switch, wherein the switches are connected on each terminal of the capacitor. A bi-phased non-overlapping clock generates non-overlapping complementary-phase first and second switching signals. The second phase drives either the second and fourth switches or the first and fourth switches, respectively, while the first phase drives the first and third switches, or the second and third switches, respectively. In response to a control signal, a control network closes all of the switches and simultaneously biases all the switches to an analog ground voltage potential.

DETAILED DESCRIPTION OF THE PREFERRED EMBODIMENT

Figure 1:
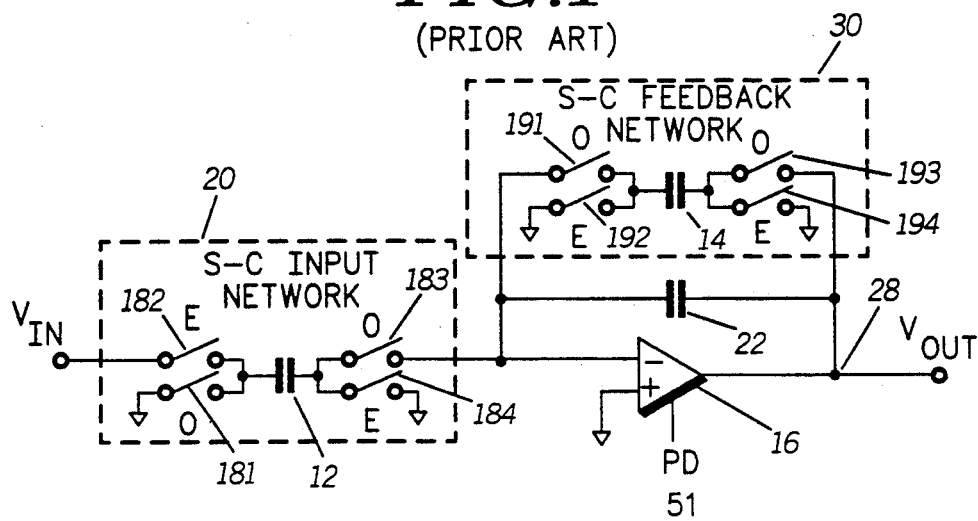
FIG. 1 is a schematic diagram of an example of a switched-capacitor circuit, implemented simply as a first order switched-capacitor low-pass filter.

To avoid the undesirable initial settling time condition of FIG. 1, all or at least some, of the internal switchable nodes of the switched-capacitor circuit should be tied together (or biased) to a well defined potential, i.e., $V_{AG}$, ground, or other reference voltages, during power-down. A switchable node is defined as a terminal having at least one switch connected to it.

Figure 2:
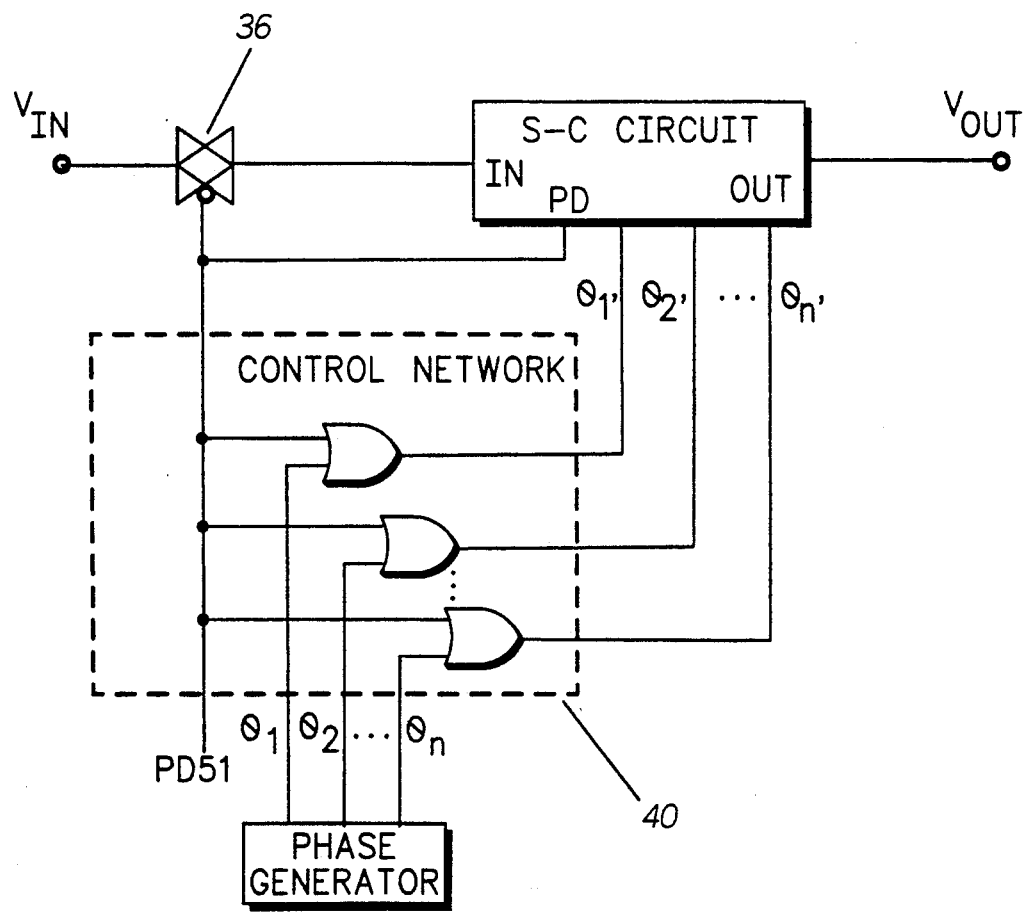
FIG. 2 is a schematic diagram of a control network for controlling all of the switched-capacitor networks of a switched-capacitor circuit in accordance with the present invention.

Referring to FIG. 2, a control network 40 provides the control for all of the switched-capacitor networks of a switched-capacitor circuit, such as the exemplary switched-capacitor filter 10 of FIG. 1. During normal operation mode, the control network 40 provides the non-overlapping switching signals, comprising at least E' and O', for the switches 181-184 and 191-194. During the power down mode, the op-amp 16 is powered down by the logic high level on the PD signal 51. In addition, the control network 40 closes all the switches by setting both E' and O' to logic high levels simultaneously.

Figure 3:
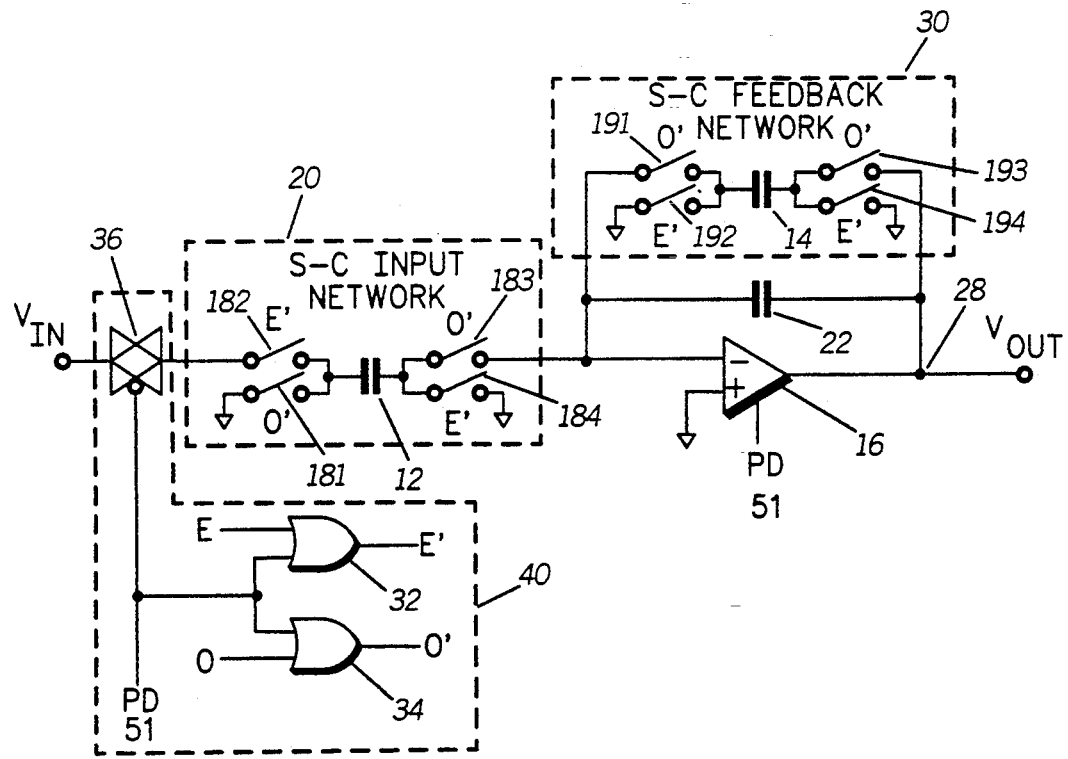
FIG. 3 is a schematic diagram of the control network of FIG. 2 controlling the switched-capacitor filter of FIG. 1.

As can be seen in FIG. 3, when E' and O' are both set to logic high levels, all the switches 18 and 19 are closed or enabled. With the switches closed, all of the internal switchable nodes of the switched-capacitor circuit 10 are automatically connected together to a virtual ground potential $V_{AG}$, thereby preventing the DC voltage transients from occurring when the circuit is reactivated.

Referring to FIGS. 2 and 3, the control network 40 ORs each of the switched-capacitor clocks with the PD signal 51, in a pair of OR gates 32 and 34, such that E', O' = 11, when the power down signal 51 goes high. Subsequently, all the switches 18 and 19 are closed and are each connected to the same known voltage reference $V_{AG}$. In this manner, all the capacitors 12, 14, and 22, and the output node 28 will be biased at the virtual ground $V_{AG}$. This pre-charged reference voltage $V_{AG}$, at all the nodes, enables the switched-capacitor circuit to be quickly powered-up.

An additional switch 36 opens to isolate the input $V_{IN}$ from being tied to $V_{AG}$ during the power down mode. In the preferred embodiment, the switches 18, 19, and 36 of FIG. 3 are implemented by MOS transistor switches, and more particularly, by CMOS transmission gates. However, any type of a switch may be used to implement switches 18, 19, and 36.

Referring to FIG. 3, during normal mode operation (PD 51=0), the switched-capacitor filter circuit 10 operates substantially as described previously (E=E', O=O'), with the reference of EVEN changed to EVEN' (E') and ODD changed to ODD' (O'), due to the addition of the low PD signal applied to each of the OR gates 32 and 34. Thus, all of the switches marked E' are closed simultaneously, then opened, followed by a closure of all the switches marked O', in the normal mode of operation.

However, in the power down mode of operation, all of the switches marked E' or O' are closed simultaneously. Since parallel switches 181, 184 and parallel switches 192, 194 connect each terminal of the capacitors 12 and 14 to the analog ground $V_{AG}$, during the power down mode, both terminals of the capacitors 12, 14, and 22, and subsequently, all the nodes, are all at the same known voltage $V_{AG}$ reference potential. Specifically, the inverting input node of the op-amp 16 is analog grounded by the closure of the switches 183 and 191, the input terminal of the switched-capacitor circuit 10 is analog grounded by the switch 182, and the output node 28 is analog grounded by the switch 193.

From the foregoing detailed description, it can thus be seen that the present invention provides switching for a switched-capacitor circuit, only during the normal mode of a switched-capacitor circuit, and thereafter, all the switching switches are closed simultaneously, during the power down mode. The switching signals, themselves, (ODD and EVEN) are not disabled, but each of the ORed outputs O' and E' are always enabled HIGH for switch closure. To enable all the switching signals HIGH, the HIGH control PD signal 51 is ORed (32 and 34) with each of the bi-phase clock signals E and O, respectively, to prevent the clock signals E and O from switching the switches.

By adding minimal devices, two OR gates and one transmission gate, in one embodiment, to the existing switched-capacitor circuit for achieving internal $V_{AG}$ biases, during power-down, the technique of the present invention is extremely efficient to implement, and eliminates internal, power-up DC recovery transients on the circuit nodes, reducing power-up settling time simply to that of the op-amp's powering-up settling time.

While the present invention has been applied to a simple switched-capacitor circuit for illustrative purposes, it could equally be applied to much more complex switched-capacitor circuits for even greater benefits.

What is claimed is:

1. A method for reducing settling time of a switched-capacitor circuit having at least one capacitor and one switch, said at least one capacitor having at least one terminal connected to said switch, the method comprising the steps of:
   clocking said switched-capacitor circuit with non-overlapping switching signals; and
   biasing said at least one terminal of said capacitor to a reference voltage potential, in response to a control signal and said non-overlapping switching signals.

2. The method of claim 1 wherein said biasing step comprises the step of disabling said switched-capacitor circuit from switching and closing said switch to connect said at least one terminal of said at least one capacitor to said reference voltage potential, in response to said control signal.

3. The method of claim 1 wherein said clocking step comprises the step of switching between the connection and disconnection of said at least one terminal of said capacitor to an operational amplifier.

4. The method of claim 3 wherein said method further comprises the step of providing said control signal to apportion said operational amplifier into a normal operating mode and a power down mode.

5. A control network for reducing settling time of a switched-capacitor circuit including at least one capacitor having at least one terminal, and a switch, wherein said at least one terminal is connected to said switch, the control network comprising:

means for clocking said switched-capacitor circuit at a switching clocking frequency wherein said means for clocking comprises a multi-phased clock generator for generating non-overlapping switching signals; and means for biasing said at least one terminal of said at least one capacitor to a reference voltage potential, in response to a control signal, wherein said means for biasing comprises means for ORing each of said non-overlapping switching signals with said control signal.

6. The control network of claim 5 wherein said means for biasing comprises:
   a first OR gate having a first input, a second input, and an output, said second input connected to said control signal, said first input connected to one of said plurality of switching signals, said output for generating an ORed version of said one of said plurality of switching signals for clocking or biasing said at least one terminal of said capacitor, in response to a respective status of said control signal; and
   a second OR gate having a first input and a second input, said first input connected to said control signal, said second input connected to another of said plurality of switching signals, said output for generating an ORed version of said another of said plurality of switching signals for clocking or biasing said at least one terminal of said capacitor, in response to a respective status of said control signal.

7. The control network of claim 5, wherein said disabling means further comprises an open switch for isolating an input signal from said switched-capacitor circuit, in response to said control signal.

8. The arrangement of claim 5 wherein said control network comprises:
   a first OR gate having a first input, a second input, and an output, said second input connected to said control signal, said first input connected to said second switching signal, said output for generating an ORed version of said second switching signal for switching said switch means, in response to said normal status of said control signal, or for connecting said switch means, in response to said power down status of said control signal;
   a second OR gate having a first input and a second input, said first input connected to said control signal, said second input connected to said first switching signal, said output for generating an ORed version of said first switching signal for switching said switch means, in response to said normal status of said control signal, or for closing said switch means, in response to said power down status of said control signal; and
   an open switch for isolating said input signal voltage from said input node of said switched-capacitor circuit, in response to said power down status of said control signal.

9. A switched-capacitor circuit and control arrangement comprising:
   a switched-capacitor circuit having switches connected to switchable internal circuit nodes;
   the switched-capacitor circuit including a plurality of non-overlapping multi-phase switching signals input terminals, an input node, and an output node;
   a control network for clocking said switched-capacitor circuit at a switching clocking frequency, in response to a normal status of a control signal, or for closing said switches for biasing the switchable internal circuit nodes of said switched-capacitor circuit to said analog ground voltage potential, in response to a power down mode status of said control signal; and the control network comprising:

a transmission gate for connecting an input signal into said input node of said switched-capacitor circuit, in response to said normal mode status of said control signal; and means for ORing a plurality of non-overlapping multi-phase switching signals with said control signal to provide said non-overlapping multi-phase switching signal into said terminals, in response to said normal mode status of said control signal, or to provide a plurality of logic level high signals into said terminals, in response to said power down mode of said control signal.

10. The arrangement of claim 9 wherein said switched-capacitor circuit includes at least one switched-capacitor network that is in an inverting charging configuration having a switch pair connected on each terminal of a capacitor that is connectable in series with the switchable internal circuit nodes.

11. The arrangement of claim 9 wherein said switched-capacitor circuit includes at least one switched-capacitor network that is in a non-inverting charging configuration having a switch pair connected on each terminal of a capacitor that is connectable in parallel with the switchable internal circuit nodes.

12. The arrangement of claim 9 wherein said switched-capacitor circuit includes at least one switched-capacitor network that is in a parasitic-insensitive configuration having a switch pair connected on each terminal of a capacitor.

13. The arrangement of claim 12 wherein said at least one said switched-capacitor network comprises:

a capacitor having first and second terminals;

a series switch pair having a first switch and a second switch connected on each terminal of said capacitor; and a parallel switch pair having a third switch and a fourth switch connected on each terminal of said capacitor.

14. The arrangement of claim 9 wherein said switched-capacitor circuit comprises:

an operational amplifier having a normal operating mode, a power down mode, an inverting input terminal, and a non-inverting input terminal;

a switched-capacitor network including a capacitor having first and second terminals and switch means for switching the coupling of said capacitor, said switch means coupled to said operational amplifier; and means for placing the operational amplifier in said normal operating mode or said power down mode, in response to a normal status or power down status of a control signal, respectively.

15. The arrangement of claim 14 wherein said control network comprises disabling means for disabling said switched-capacitor network from switching and for connecting each of said terminals of said capacitor to said analog ground voltage potential, in said power down mode, in response to the power down status of said control signal.

16. The arrangement of claim 15, wherein said switched-capacitor network comprises:

a bi-phased clock for generating complementary-phase first and second switching signals;

capacitor switching means for coupling said capacitor to said operational amplifier, said capacitor switching means having first, second, third, and fourth switch means for switching said capacitor, said second and third switch means serially connecting to said inverting input terminal of said operational amplifier, said first and fourth switch means parallelly connecting to said analog ground voltage potential;

in said power down mode:

said second switch means connected to said first terminal of said capacitor, in response to said first or second switching signal and to said power down status of said control signal, said second terminal of said capacitor coupled to said analog ground voltage potential and to said fourth switch means, in response to said first or second switching signal and to said power down status of said control signal, said first terminal of said capacitor coupled to said analog ground voltage potential and to said first switch means, in response to said first or second switching signal and to said power down status of said control signal, and said third switch means for coupling said second terminal of said capacitor to said inverting input terminal of said operational amplifier, in response to said first or second switching signal and to said power down status of said control signal.

* * * * *